United States Patent
Wang et al.

(10) Patent No.: US 10,424,604 B2
(45) Date of Patent: Sep. 24, 2019

(54) ARRAY SUBSTRATE, MANUFACTURING METHOD THEREOF, AND DISPLAY APPARATUS

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Rui Wang, Beijing (CN); Haijun Qiu, Beijing (CN); Fei Shang, Beijing (CN); Jaikwang Kim, Beijing (CN); Shaoru Li, Beijing (CN); Zhuo Xu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

(*) Notice: Subject to any disclaimer, the term of this patent is extended or adjusted under 35 U.S.C. 154(b) by 0 days.

(21) Appl. No.: 15/529,495

(22) PCT Filed: Nov. 7, 2016

(86) PCT No.: PCT/CN2016/104910
§ 371 (c)(1),
(2) Date: May 24, 2017

(87) PCT Pub. No.: WO2017/166817
PCT Pub. Date: Oct. 5, 2017

(65) Prior Publication Data
US 2019/0019815 A1 Jan. 17, 2019

(30) Foreign Application Priority Data
Mar. 31, 2016 (CN) .......................... 2016 1 0197197

(51) Int. Cl.
*H01L 27/28* (2006.01)
*H01L 27/12* (2006.01)
(Continued)

(52) U.S. Cl.
CPC .... *H01L 27/1244* (2013.01); *G02F 1/133512* (2013.01); *G02F 1/134309* (2013.01);
(Continued)

(58) Field of Classification Search
CPC . H01L 27/1244; H01L 27/124; H01L 27/127; H01L 27/1262; H01L 2021/775;
(Continued)

(56) References Cited

U.S. PATENT DOCUMENTS

2004/0141124 A1* 7/2004 Kim ................. G02F 1/133512
349/126
2015/0138479 A1* 5/2015 Lee ................. G02F 1/136286
349/44

(Continued)

FOREIGN PATENT DOCUMENTS

CN 105425491 A 3/2016
WO 2017045350 A1 3/2017

OTHER PUBLICATIONS

Second Office Action dated Jun. 29, 2018 in CN201610197197.1.
(Continued)

*Primary Examiner* — Cuong B Nguyen
*Assistant Examiner* — Samuel Park
(74) *Attorney, Agent, or Firm* — Syncoda LLC; Feng Ma (57) ABSTRACT

The present disclosure provides an array substrate, its manufacturing method, and a display apparatus containing the array substrate. The array substrate includes: a substrate; a plurality of gate lines and a plurality of data lines, disposed over the substrate and arranged in rows and columns respectively; and a plurality of pixel regions, each arranged in an (Continued)

area defined by crossing gate lines and data lines and comprising a pixel electrode. The plurality of data lines are configured such that in each pixel region, orthographic projection of any one of the plurality of data lines on the substrate and orthographic projection of a corresponding pixel electrode on the substrate has an overlapping area having a width of ≥0 μm.

15 Claims, 5 Drawing Sheets

(51) Int. Cl.
    *G02F 1/1335*     (2006.01)
    *G02F 1/1343*     (2006.01)
    *G02F 1/1362*     (2006.01)

(52) U.S. Cl.
    CPC .. *G02F 1/136213* (2013.01); *G02F 1/136286* (2013.01); *H01L 27/124* (2013.01); *H01L 27/127* (2013.01); *H01L 27/1262* (2013.01); *G02F 2201/123* (2013.01)

(58) Field of Classification Search
    CPC ............. H01L 27/3232; H01L 51/0076; H01L 27/14603; H01L 27/14605; H01L 27/14609; H01L 27/14812; H01L 27/3248; H01L 27/326; G02F 1/134309; G02F 1/136213; G02F 1/133512; G02F 1/136286; G02F 2201/123
    See application file for complete search history.

(56) References Cited

U.S. PATENT DOCUMENTS

2016/0202538 A1\*   7/2016   Lee .................. G02F 1/133345
                                                        257/72
2018/0226429 A1     8/2018   Ma et al.

OTHER PUBLICATIONS

First Office Action dated Jan. 4, 2018 in CN201610197197.1.
International Search Report and Written Opinion dated Feb. 16, 2017 in PCT/CN2016/104910.

\* cited by examiner

ARRAY SUBSTRATE, MANUFACTURING METHOD THEREOF, AND DISPLAY APPARATUS

CROSS-REFERENCE TO RELATED APPLICATION

The present application claims priority to Chinese Patent Application No. 201610197197.1 filed on Mar. 31, 2016, the disclosure of which is hereby incorporated by reference in its entirety.

TECHNICAL FIELD

The present disclosure relates generally to display technologies, and more specifically to an array substrate, its manufacturing method, and a display apparatus containing the array substrate.

BACKGROUND

A conventional thin-film transistor liquid crystal display apparatus typically employs a single-gate line or a double-gate line array substrate. Compared with the single-gate line structure, the double-gate line structure has advantages such as low power consumption and low cost.

SUMMARY

The present disclosure provides an array substrate, its manufacturing method, and a display apparatus containing the array substrate.

In one aspect, an array substrate is provided, which includes: a substrate; a plurality of gate lines and a plurality of data lines, disposed over the substrate and arranged in rows and columns respectively; and a plurality of pixel regions, each arranged in an area defined by crossing gate lines and data lines and comprising a pixel electrode.

The plurality of data lines are configured such that in each pixel region, orthographic projection of any one of the plurality of data lines on the substrate and orthographic projection of a corresponding pixel electrode on the substrate has an overlapping area having a width of ≥0 μm.

In some preferred embodiments, a width of the overlapping area can have a range of about 2-3.5 μm.

In some embodiments, the array substrate can further include at least one organic insulating layer, which is disposed between any one of the plurality of data lines and the corresponding pixel electrode in each pixel region.

In some embodiments, the array substrate can further include a shielding layer, which is disposed over, and configured to reduce or prevent light leakage from, a periphery of each pixel region. Herein the periphery of a pixel region can be defined as any region surrounding the pixel region, which includes, for example, a surrounding region between the pixel region and the gate line, but can also include other surrounding regions.

In each pixel region of the array substrate according to these above embodiments, orthographic projection of the shielding layer on the substrate can be configured to overlap with a gap between orthographic projection of any gate line and orthographic projection of the pixel electrode.

In some embodiments of the array substrate, two gate lines can be arranged between every two adjacent rows of pixel regions, and two columns of pixel regions are arranged between every two adjacent data lines.

In these above embodiments, each data line can comprise a first portion, which is disposed over a first gap between two adjacent pixel regions, and configured such that a width of the first portion of each data line is substantially equal to, or more than, a width of the first gap between the two adjacent pixel regions.

The shielding layer can further comprise a second portion, which is disposed over a second gap between two neighboring pixel regions arranged between two adjacent data lines, and configured such that a width of the second portion of the shielding layer is substantially equal to, or more than, a width of the second gap between the two neighboring pixel regions.

In some embodiments of the array substrate, the shielding layer can be electrically coupled to a common electrode; and the shield layer can comprise a metal.

The array substrate can further comprise a plurality of thin-film transistors. Each of the plurality of thin-film transistors can be arranged in one of the plurality of pixel regions. Each of the plurality of thin-film transistors can comprise a gate electrode, wherein the gate electrode, the shielding layer and the plurality of gate lines are disposed in a same gate metal layer and comprise a same composition.

In these above embodiments of the array substrate, each thin-film transistor can further include a gate insulating layer, which is disposed over the gate metal layer and comprises at least one organic insulating layer.

In these above embodiments of the array substrate, each thin-film transistor can further include a drain electrode. The drain electrode and the shielding layer can be configured to substantially contribute to a storage capacitance of the pixel in each pixel region.

As such, each thin-film transistor can further include a passivation layer, which is disposed between, and configured to insulate, the drain electrode and the pixel electrode in each pixel region. The passivation layer can be provided with a via, which is configured to electrically couple the pixel electrode with the drain electrode therethrough; and the passivation layer can further comprise at least one organic insulating layer.

In some embodiments of the array substrate, in each pixel region, the storage capacitance can comprise a first storage capacitor and a second storage capacitor. A portion of the drain electrode corresponding to the via is disposed to directly face the shielding layer to thereby form the first storage capacitor; and the pixel electrode and the shielding layer are configured to form the second storage capacitor.

In a second aspect, this present disclosure also provides a display apparatus, which includes the array substrate according to any one of the embodiments as described above.

In a third aspect, this present disclosure further provides a method for fabricating the array substrate as described above.

The method can include the following steps:
Forming a plurality of gate lines over a substrate;
Forming a plurality of data lines, wherein the plurality of gate lines and the plurality of data lines cross one another to define a plurality of areas for arranging each of a plurality of pixel regions therein; and
Forming a pixel electrode in each of the plurality of pixel regions, wherein in each pixel region orthographic projection of any one of the plurality of data lines on the substrate and orthographic projection of a corresponding pixel electrode on the substrate are configured to have an overlapping area having a width of ≥0 μm.

In some embodiments of the method, the step of forming a plurality of gate lines over a substrate comprises: forming a plurality of gate lines and a shielding layer over a substrate. The plurality of gate lines and the shielding layer can be configured to be disposed in a same layer and comprise a same composition; and the shielding layer can be configured to be disposed over, and configured to reduce or prevent light leakage from, a periphery of each pixel region.

Herein the periphery of a pixel region can be defined as any region surrounding the pixel region, which includes, for example, a surrounding region between the pixel region and the gate line, but can also include other surrounding regions.

The array substrate can comprise a plurality of thin-film transistors. Each of the plurality of thin-film transistors can be configured to be disposed in each pixel region. Each of the plurality of thin-film transistors can comprise a gate electrode, a drain electrode, and a source electrode. In these embodiments of the method, the step of forming a plurality of gate lines over a substrate can comprise: forming the gate electrode and the shielding layer in each pixel region and the plurality of gate lines by patterning over a gate metal layer.

Between the step of forming a plurality of gate lines over a substrate and the step of the step of forming a plurality of data lines, the method can further include the following step:

Forming a gate insulating layer over the gate electrode and the shielding layer and the plurality of gate lines, wherein the gate insulating layer comprises at least one organic insulating layer.

Between the step of forming a plurality of data lines and the step of forming a pixel electrode in each of the plurality of pixel regions, the method can further include the following step:

Forming a drain electrode and a passivation layer in each pixel region, wherein the passivation layer comprises an organic insulating layer and is provided with a via, and the pixel electrode is electrically coupled with the drain electrode through the via.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Figure 1:
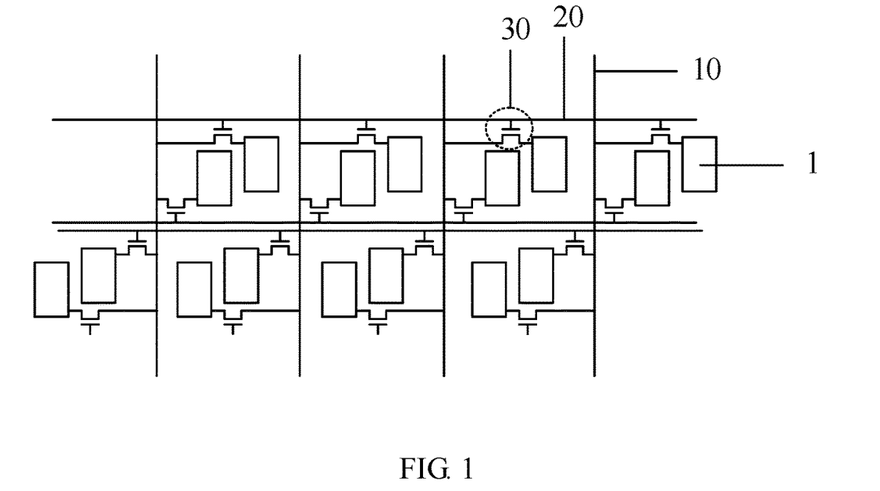
FIG. 1 is a structural diagram of an array substrate having a double-gate line structure.

A conventional double-gate line array substrate is illustrated in FIG. 1. In the array substrate, two gate lines 20 are arranged between two adjacent rows of pixel regions, and two columns of pixel regions are arranged between two adjacent data lines 10. As for a same row of pixel regions, the gate electrodes of thin-film transistors 30 in odd numbered pixels are connected with one gate line 20; the gate electrodes of thin-film transistors 30 in even numbered pixels are connected with another gate line 20; and the source electrodes of thin-film transistors 30 from two adjacent columns of pixel regions are connected with a same data line 10.

Figure 2:
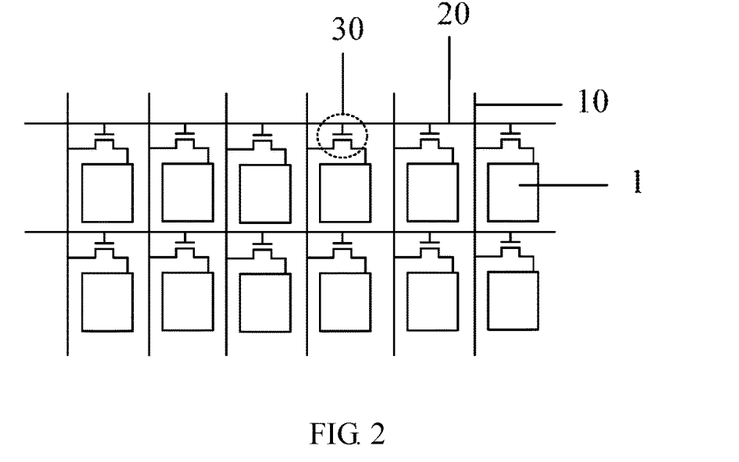
FIG. 2 is a structural diagram of an array substrate having a single-gate line structure.

Compared with a conventional single-gate line array substrate, as illustrated in FIG. 2, where one gate line 20 is arranged between two adjacent rows of pixel regions, and one column of pixel regions is arranged between two adjacent data lines 10, the double-gate line array substrate uses two times number of gate lines and half number of data lines.

Regardless of a single-gate line array substrate or a double-gate line array substrate, there is typically a gap between the pixel electrode 1 and the data line 10 in the surrounding area of a pixel region. In order to prevent light leakage, the area of the black matrix over the color film substrate needs to be increased.

However, if the display apparatus is impacted, alignment deviation can occur between the array substrate and the color film substrate, causing that the gap between the pixel electrode 1 and the data line 10 is not aligned well with the black matrix, ultimately leading to light leakage. As such, display panels with these conventional structures have a disadvantage of light leakage, which can significantly affect the display quality.

To address the issue of light leakage at the surrounding area of pixel regions that is commonly seen upon impacts on the display apparatus, this present disclosure provides an array substrate, its manufacturing method, and a display apparatus containing the array substrate.

In one aspect, an array substrate is provided, which comprises: a substrate; a plurality of gate lines and a plurality of data lines, disposed over the substrate and arranged in rows and columns respectively; and a plurality of pixel regions, each arranged in an area defined by crossing gate lines and data lines and comprising a pixel electrode.

The plurality of data lines are configured such that in each pixel region, orthographic projection of any one of the plurality of data lines on the substrate and orthographic projection of a corresponding pixel electrode on the substrate has an overlapping area having a width of ≥0 μm.

In some embodiments, an array substrate having a single-gate line structure is disclosed, as shown in FIGS. 2-5. The array substrate includes a plurality of gate lines 20, aligned in rows, and a plurality of data lines 10, aligned in columns. Both of the gate lines 20 and data lines 10 are disposed on a substrate 101 and together define a plurality of pixel regions. The array substrate also includes a plurality of pixel electrodes 1, each disposed within one of the plurality of pixel regions.

The array substrate is configured such that the orthographic projection of the data line 10 on the substrate 101 overlaps with the orthographic projection of the pixel electrode 1 on the substrate 101 within each of the plurality of pixel regions, to thereby effectively prevent light leakage at a surrounding sub-region of each of the plurality of pixel regions. The configuration can further remove the need to increase the area of the black matrix over the color film substrate due to the alignment deviation between the array substrate and the color film substrate, thus leading to an increased opening ratio of the pixels.

The working mechanism is as follows. By increasing the width of data lines 10, the orthographic projection of the data line 10 on the substrate 101 is thereby able to overlap with the orthographic projection of the pixel electrode 1 on the substrate 101 within each of the plurality of pixel regions.

The issue of light leakage at a surrounding sub-region of each of the plurality of pixel regions can thus be effectively prevented as a result of the alignment deviation between the array substrate and the color film substrate. As such, a display apparatus employing the array substrate as described above can have an improved display quality.

Figure 5:
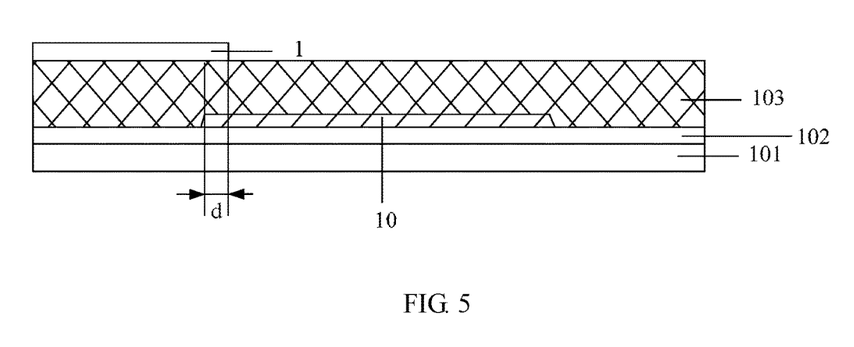
FIG. 5 is a cross-sectional view of FIG. 3 along B-B.

The width of the overlapping region between the orthographic projection of the data line 10 on the substrate 101 and the orthographic projection of the pixel electrode 1 on the substrate 101 can be ranged 2-3.5 µm, as shown in FIG. 5.

Figure 3:
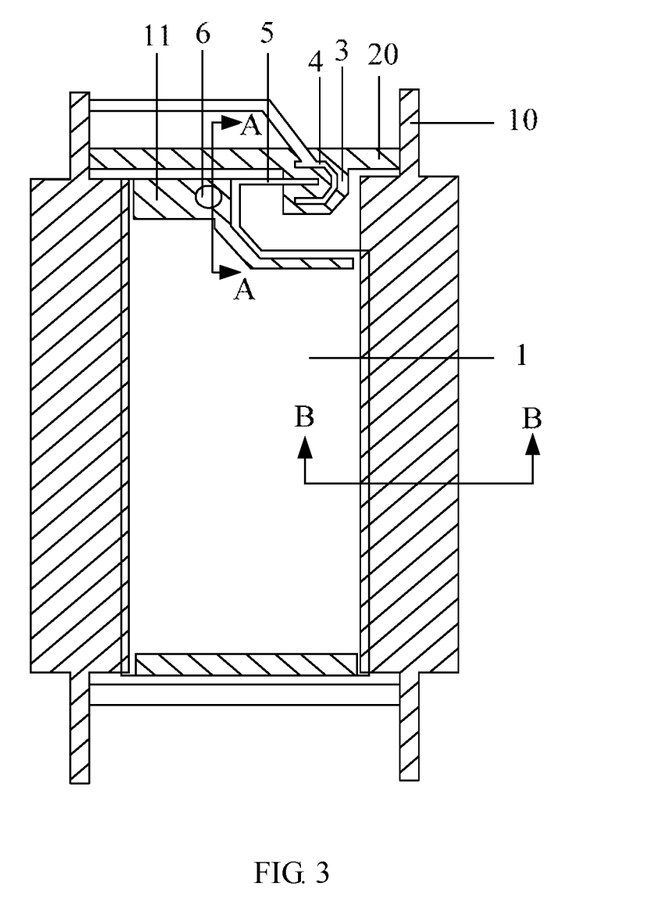
FIG. 3 is partial view of a structural diagram of an array substrate having a single-gate line structure according to some embodiments of the disclosure.

The array substrate can also include a plurality of thin-film transistors 30, each disposed in a pixel region and serving as a switch to control the display.

In the single-gate line thin-film transistor array substrate as described above and shown in FIG. 3, one gate line 20 is arranged between two adjacent rows of pixel regions, and one column of pixel regions is arranged between two adjacent data lines 10. The gate electrode 3 of the thin-film transistor 30 in each of a row of pixel regions is electrically connected with a same gate line 20; and the source electrode 4 of the thin-film transistor 30 in each of a column of pixel regions is electrically connected with a same date line 10. The drain electrode 5 of the thin-film transistor 30 in each pixel region is electrically connected with the pixel electrode 1 in the same pixel region.

Specifically, the gate electrodes 3 and the gate lines 20 are in a same gate metal layer, and one gate electrode 3 is integrated with a corresponding gate line 20 as an integral structure; the source electrodes 4 and the date lines 10 are in a same source-drain metal layer, and one source electrode 4 is integrated with a corresponding data line 10 as an integral structure; and one drain electrode 5 is electrically connected with a corresponding pixel electrode 1 through a via 6 arranged across an insulating layer between the drain electrode 5 and the pixel electrode 1.

During display, the gate line scan signal opens the thin-film transistors row by row, then through the data lines 10, the data signal is transmitted to the pixel electrodes 1, and an electric field forms between each of the pixel electrodes 1 and a common electrode, tilting the liquid crystal molecules to thereby achieve a display. A common voltage signal is applied to the common electrodes.

Depending on the direction of the electric field for driving the liquid crystal molecules, a thin-film transistor liquid crystal display apparatus can be classified into a vertical electric field type and a horizontal electric field type. The vertical electric field type can include a Twisted Nematic (TN) subtype, and the horizontal electric field type can include an ADvanced Super Dimension Switch (ADSDS) subtype and an In-Plane Switching (IPS) subtype. In a TN-subtype thin-film transistor liquid crystal display apparatus, for example, common electrodes can be formed in the color film substrate.

In some embodiments, the array substrate can be configured to further include a shielding layer, which is disposed over, and configured to reduce or prevent light leakage from, a periphery of each pixel region. Herein the periphery of a pixel region can be defined as any region surrounding the pixel region, which includes, for example, a surrounding region between the pixel region and the gate line, but can also include other surrounding regions.

In order to further increase the storage capacitance, the shielding layer can comprise a metal, and can thus be in the form of a conductive pattern, shown in FIG. 3. The shielding layer 11 can be arranged at a surrounding sub-region between the pixel electrode 1 and the gate line 20. Herein the surrounding sub-region of a pixel region refers to a sub-region between a pixel electrode 1 and a data line 10, and between a pixel electrode 1 and a gate line 20.

Upon application of a common voltage on the shielding layer 11 (i.e. conductive pattern), a storage capacitor forms between the shielding layer 11 and the pixel electrode 1, which maintains a data voltage on the pixel electrode 1 in the time period of one frame display, thus improving the display quality.

In order to simplify manufacturing processes and to save manufacturing costs, the shielding layer 11 of all pixel regions can be made from a same metal film layer. Specifically, the shielding layer 11, the gate electrodes 3, and the gate lines 20 can be made from a same gate metal layer.

The gate metal layer can comprise a metal such as Cu, Al, Ag, Mo, Cr, Nd, Ni, Mn, Ti, Ta, and W, or an alloy comprising at least two of these above mentioned metals. The gate metal layer can be single-layered or multi-layered. Examples of a multi-layered gate metal layer can comprise Cu\Mo, Ti\Cu\Ti, or Mo\Al\Mo.

To reduce the parasitic capacitance due to the common voltage applied on the shielding layer 11 (i.e. conductive pattern), at least one organic insulating layer can be disposed between any one of the plurality of data lines and the corresponding pixel electrode in each pixel region. As such, at least one of a gate insulating layer 102 and a passivation layer 103 for the thin-film transistor in each pixel region can be configured to comprise an organic insulating layer.

For example, a gate insulating layer 102 comprising an organic insulating layer can be disposed between the data lines 10 and the shielding layer 11 (i.e. conductive pattern). If the shielding layer 11 and the gate lines 20 are both made from a same gate metal layer, the gate insulating layer 102 can also be disposed between the gate lines 20 and the shielding layer 11.

Because the organic insulating layer is much thicker than an inorganic insulating layer, the parasitic capacitance between the gate lines 20 and the data lines 10 can thus be reduced, leading to reduced load and power consumption.

Figure 4:
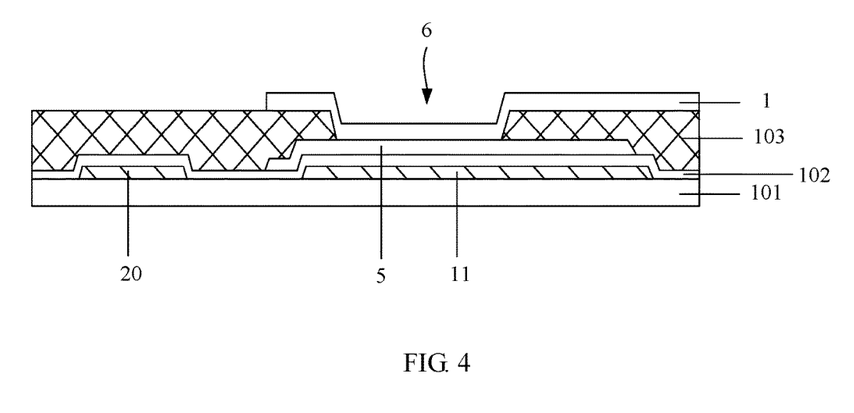
FIG. 4 is a cross-sectional view of FIG. 3 along A-A.

In another example as shown in FIG. 4, a passivation layer 103 comprising an organic insulating layer can be disposed between the drain electrode 5 and the pixel electrode 1 in the thin-film transistor. The drain electrode 5 and the pixel electrode 1 are electrically connected through a via 6 in the passivation layer 103. The portion of the drain electrode 5 corresponding to the via 6 is directly faced with the shielding layer 11.

Because of the relative large thickness of the organic insulating layer, the size of the via 6 is relatively large, and the area of the facing region between the drain electrode 5 and the shielding layer 11 (i.e. conductive pattern) is relative large, and the capacitor formed between the drain electrode 5 and the shielding layer 11 (i.e. source-drain metal layer-insulating layer-gate metal layer) can further effectively increase the storage capacitance of pixels.

A bottom-gate thin-film transistor array substrate is illustrated in the following as an example. As shown in FIGS. 2-5, the array substrate includes the following.

A substrate 101, comprising a transparent substrate and having a composition of a glass, a quartz, or an organic resin.

A plurality of gate lines 20 and a plurality of data lines 10, disposed over the substrate 101 and together defining a plurality of pixel regions, wherein one gate line 20 is arranged between two adjacent rows of pixel regions, and one column of pixel regions is arranged between two adjacent data lines 10.

Each pixel region includes a gate electrode 3 of a thin-film transistor 30 and a conductive pattern 11. The gate electrode 3 is electrically connected with a gate line 20. The gate electrodes 3, the conductive pattern 11, and the gate line 20 is made from a same gate metal layer. The shielding layer 11 is disposed on a surrounding sub-region between the pixel region and the gate line 20, and is configured to prevent the light leakage from the pixel region.

A gate insulating layer 102 that is disposed over the gate electrode 3, the shielding layer 11 (i.e. conductive pattern), and the gate line 20 is configured to comprise an organic insulating layer.

A source layer of the thin-film transistor 30 disposed over the gate insulating layer 102 (not shown in figures) comprises a silicon semiconductor or a metal oxide semiconductor.

A source electrode 4 and a drain electrode 5 are respectively disposed on the two ends of the source layer. The source electrode 4 and the data line 10 is electrically connected. The source electrode 4, the drain electrode 5, and the data line 10 are manufactured in a same source-drain metal layer.

A passivation layer 103 disposed to cover the whole thin-film transistor 30 can comprise an organic insulating layer, and is provided with a via 6 configured to expose the drain electrode 5 of the thin-film transistor 30.

Orthographic projection of the data line 10 on the substrate 101 is configured to overlap with orthographic projection of the pixel electrode 1 on the substrate 101, to thereby effectively prevent light leakage at a surrounding sub-region of the pixel region. The pixel electrode 1 is electrically connected with the drain electrode 5 through the via 6 across the passivation layer 103.

The portion of the drain electrode 5 corresponding to the via 6 is directly faced with the shielding layer 11 (i.e. conductive pattern), and together form a first storage capacitor. The pixel electrode 1 and the shielding layer 11 together form a second storage capacitor. These two storage capacitors together increase the storage capacitance, and thus improve the quality of display.

The pixel electrode 1 can comprise a transparent metal oxide, such as HIZO, ZnO, TiO2, CdSnO, MgZnO, IGO, IZO, ITO, or IGZO.

The gate insulating layer 102 and the passivation layer 103 as described above can be organic insulating layers, which can effectively reduce the parasitic capacitance between the gate line 20 and the data line 10, leading to reduced load and power consumption.

It is noted that the technical solution as described in this embodiment of the present disclosure can be applied not only in a bottom-gate thin-film transistor array substrate, but also in other types of the thin-film transistor array substrate, such as a top-gate thin-film transistor array substrate, and a co-planar thin-film transistor array substrate.

In some other embodiments, an array substrate having a double-gate line structure is disclosed, as shown in FIGS. 1 and 6-8.

Figure 6:
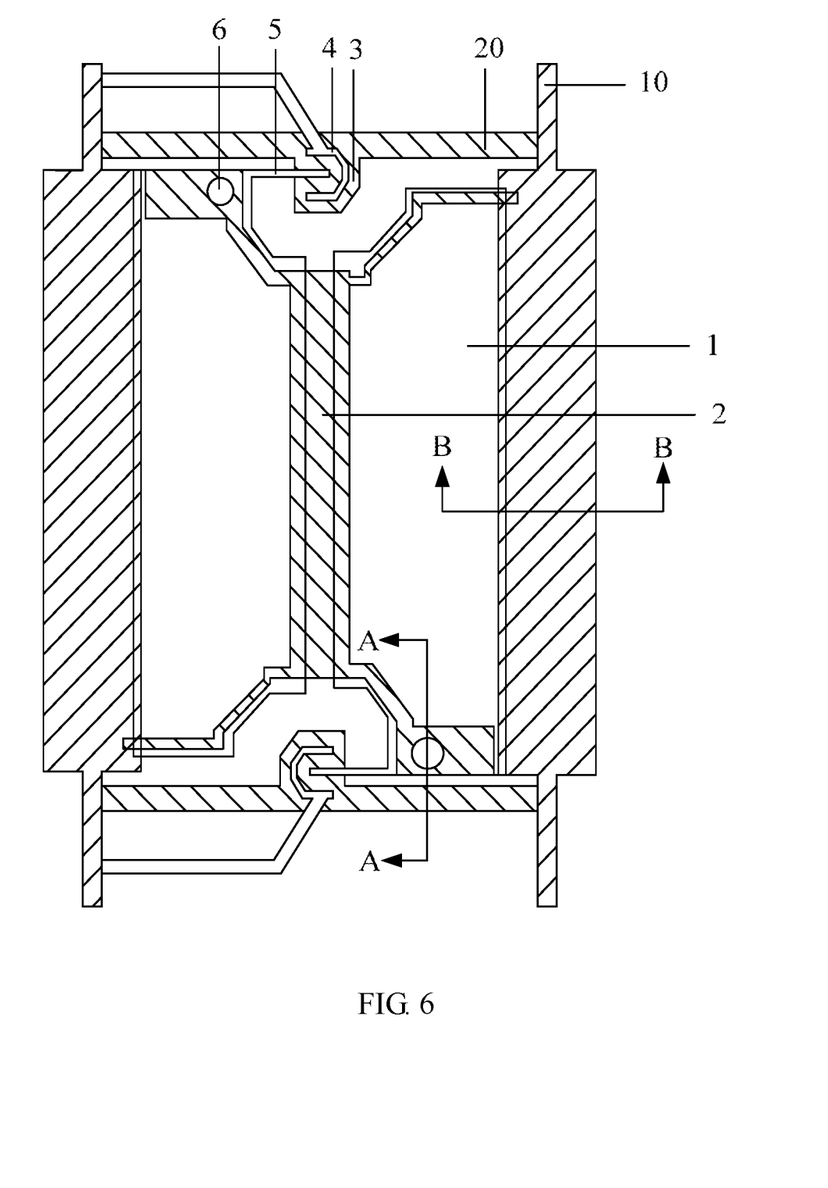
FIG. 6 is partial view of a structural diagram of an array substrate having a double-gate line structure according to some embodiments of the disclosure.

In the array substrate, two gate lines 20 are arranged between two adjacent rows of pixel regions, and two columns of pixel regions are arranged between two adjacent data lines 10. As for a same row of pixel regions, the gate electrodes 3 of thin-film transistors 30 in odd numbered pixel regions are connected with one gate line 20; the gate electrodes of thin-film transistors 30 in even numbered pixel regions are connected with another gate line 20; and the source electrodes 4 of thin-film transistors 30 from two adjacent columns of pixel regions are connected with a same data line 10. Compared with a single-gate line array substrate, the double-gate line array substrate uses two times number of gate lines and half number of data lines.

In this embodiment, a data line 10 is configured on only one side of each pixel region, and its orthographic projection on the substrate 101 is configured to overlap with the orthographic projection of the pixel electrode 1 on the substrate 101. This configuration can effectively prevent light leakage on the surrounding sub-region between the pixel region and the data line 10.

Compared with current technologies, the embodiment as disclosed herein can additionally increase the opening ratio of pixels, whose working mechanism has been described above and is not repeated herein.

In addition, by increasing the width of the data line 10 to prevent light leakage in the pixel regions, the difference between the gap distance corresponding to a sub-region between the data line 10 and a neighboring pixel electrode 1 and the gap distance at other sub-regions is reduced, thereby the issues such as the appearance of dim lines that is due to a large gap distance difference can be effectively prevented.

If the above array substrate is employed in a display apparatus, the display quality can be improved.

Figure 8:
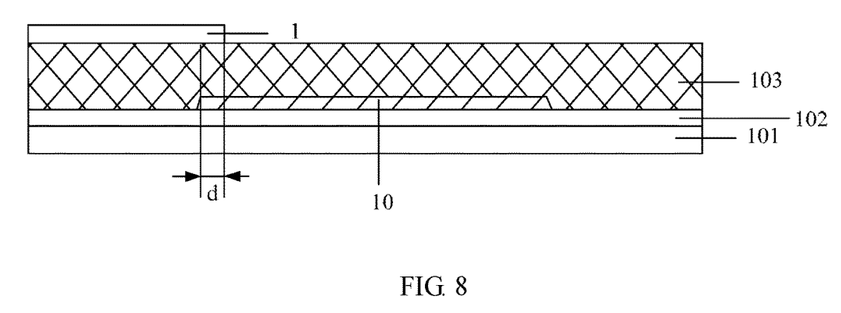
FIG. 8 is a cross-sectional view of FIG. 6 along B-B.

In some embodiments, the width of the overlapping region between the orthographic projection of the data line 10 on the substrate 101 and the orthographic projection of the pixel electrode 1 on the substrate 101 can be ranged 2-3.5 μm, as shown in FIG. 8.

In this embodiment, a data line 10 is configured on only one side of each pixel region, and in order to prevent the light leakage at the surrounding sub-region between the pixel electrode 1 and the data line 10. A shielding layer 2 is arranged at a surrounding sub-region between the pixel electrode 1 and the gate line 20, and at a sub-region between the two adjacent columns of pixel electrodes within two neighboring data lines 10, to thereby prevent light leakage in the pixel regions. Herein the surrounding sub-region refers to a sub-region which surrounds the pixel electrode 1 in each pixel region.

Figure 7:
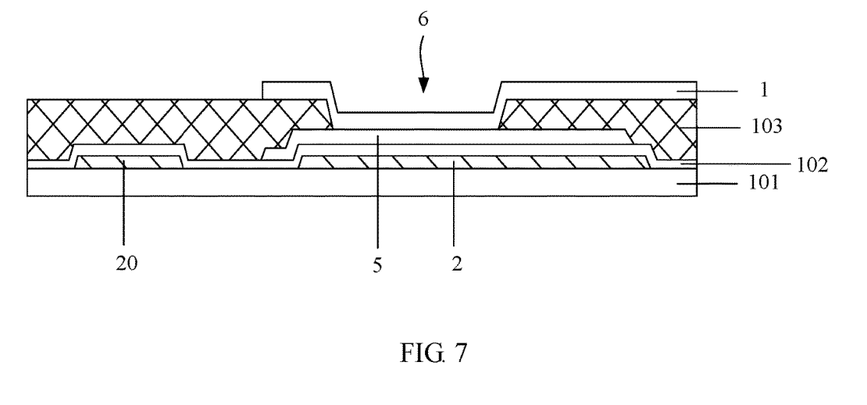
FIG. 7 is a cross-sectional view of FIG. 6 along A-A.

In some embodiments the shielding layer 2 comprises a metal, which can form a storage capacitor with a pixel electrode 1, and is thus appropriate especially for a TN-subtype thin-film transistor liquid crystal display apparatus. Specifically as shown in FIG. 7, a passivation layer 103 between the drain electrode 5 and the pixel electrode 1 in the thin-film transistor can be configured to comprise an organic insulating layer, and the drain electrode 5 and the pixel electrode 1 are electrically connected through a via 6 in the passivation layer 103.

The portion of the drain electrode 5 corresponding to the via 6 is directly faced with the shielding layer 2. Because of the relative large thickness of the organic insulating layer, the size of the via 6 is relatively large, and the area of the facing region between the drain electrode 5 and the shielding layer 2 is relative large, and the capacitor formed between the drain electrode 5 and the shielding layer 2 (i.e. source-drain metal layer-insulating layer-gate metal layer) can effectively increase the storage capacitance of pixels. A common voltage is applied to the shielding layer 2.

In order to simplify manufacturing processes and save manufacturing costs, the shielding layer 2 of all pixel regions can be made from a same metal film layer. Specifically, the shielding layer 2, the gate electrodes 3, and the gate lines 20 can be made from a same gate metal layer.

The gate metal layer can comprise a metal such as Cu, Al, Ag, Mo, Cr, Nd, Ni, Mn, Ti, Ta, and W, or an alloy comprising at least two of these above mentioned metals. The gate metal layer can be single-layered or multi-layered. Examples of a multi-layered gate metal layer can comprise Cu\Mo, Ti\Cu\Ti, or Mo\Al\Mo.

To reduce the parasitic capacitance due to the common voltage applied on the shielding layer 2, an organic insulating layer can be disposed between a data line 10 and the shielding layer 2. If the shielding layer 2 and the gate lines 20 are both made from a same gate metal layer, the gate insulating layer 102 disposed between the gate lines 20 and the shielding layer 2 can comprise an organic insulating layer.

Because the organic insulating layer is much thicker than an inorganic insulating layer, the parasitic capacitance between the gate lines 20 and the data lines 10 can thus be reduced, leading to reduced load and power consumption.

A bottom-gate thin-film transistor array substrate is illustrated in the following as an example. As shown in FIGS. 1 and 6-8, the array substrate includes the following.

A substrate 101, comprising a transparent substrate and having a composition of a glass, a quartz, or an organic resin.

A plurality of gate lines 20 and a plurality of data lines 10, disposed over the substrate 101 and together defining a plurality of pixel regions, wherein two gate lines 20 are arranged between two adjacent rows of pixel regions, and two columns of pixel regions are arranged between two adjacent data lines 10.

Each pixel region includes a gate electrode 3 of a thin-film transistor 30 and a shielding layer 2. The gate electrode 3 is electrically connected with a gate line 20. The gate electrodes 3, the shielding layer 2, and the gate line 20 are in a same gate metal layer. The shielding layer 2 is disposed on a surrounding sub-region between the pixel electrode 1 and the gate line 20, and is configured to prevent the light leakage from the surrounding sub-regions of the pixel region.

A gate insulating layer 102 that is disposed over the gate electrode 3, the shielding layer 2, and the gate line 20 is configured to comprise an organic insulating layer.

A source layer of the thin-film transistor 30 disposed over the gate insulating layer 102 (not shown in figures) comprises a silicon semiconductor or a metal oxide semiconductor.

A source electrode 4 and a drain electrode 5 are respectively disposed on the two ends of the source layer. The source electrode 4 and the data line 10 is electrically connected. The source electrode 4, the drain electrode 5, and the data line 10 are in a same source-drain metal layer.

A passivation layer 103 disposed to cover the whole thin-film transistor 30 comprise an organic insulating layer, and is provided with a via 6 configured to expose the drain electrode 5 of the thin-film transistor 30.

Orthographic projection of the data line 10 on the substrate 101 is configured to overlap with orthographic projection of the pixel electrode 1 on the substrate 101, to thereby effectively prevent light leakage at a surrounding sub-region of the pixel region. The pixel electrode 1 is electrically connected with the drain electrode 5 through the via 6 across the passivation layer 103.

The portion of the drain electrode 5 corresponding to the via 6 is directly faced with the shielding layer 2, and together form a first storage capacitor. The pixel electrode 1 and the shielding layer 2 together form a second storage capacitor. These two storage capacitors together increase the storage capacitance, and thus improve the quality of display.

The pixel electrode 1 can comprise a transparent metal oxide, such as HIZO, ZnO, TiO2, CdSnO, MgZnO, IGO, IZO, ITO, or IGZO.

The gate insulating layer 102 and the passivation layer 103 as described above can be organic insulating layers, which can effectively reduce the parasitic capacitance between the gate line 20 and the data line 10, leading to reduced load and power consumption.

It is noted that the technical solution as described in this embodiment of the present disclosure can be applied not only in a bottom-gate thin-film transistor array substrate, but also in other types of the thin-film transistor array substrate, such as a top-gate thin-film transistor array substrate, and a co-planar thin-film transistor array substrate.

In another aspect, the present disclosure provides a method for fabricating the array substrate as described above, as follows.

In some embodiments, a method for fabricating the array substrate having a single-gate line structure is disclosed. The method includes:

Forming a plurality of gate lines and a plurality of data lines over a substrate, wherein the plurality of gate lines and the plurality of data lines cross one another to define a plurality of pixel regions, one gate line is arranged between two adjacent rows of pixel regions, and one column of pixel regions is arranged between two adjacent data lines;

Forming a pixel electrode in each pixel region, wherein the orthographic projection of a data line on the substrate is configured to overlap with orthographic projection of the each pixel electrode on the substrate to thereby prevent light leakage in the pixel region.

In a TN-subtype thin-film transistor liquid crystal display apparatus, the common electrodes are formed in a color film substrate. In order to increase the storage capacitance, the method for fabricating the array substrate further includes:

Forming a thin-film transistor in each pixel region;

Forming a passivation layer between a drain electrode of the thin-film transistor and a pixel electrode, wherein the passivation layer comprises an organic insulating layer, the passivation layer is provided with a via, and the pixel electrode is electrically connected with the drain electrode through the via;

Forming a conductive pattern (i.e. shielding layer that comprises metal) at a surrounding sub-region between a pixel electrode and a gate line in each pixel region, wherein a portion of the drain electrode corresponding to the via is faced directly with the conductive pattern to thereby form a storage capacitor between the drain electrode and the conductive pattern upon application of a common voltage on the conductive pattern.

In some preferred embodiments, the conductive pattern of all of the plurality of pixel regions can be formed by a patterning process over a same metal layer. Specifically, the gate lines and the conductive pattern of all pixel regions can be formed by the patterning process over a same gate metal layer.

The methods for forming other parts of the array substrate can be referenced to prior art and are not repeated herein.

In some other embodiments, a method for fabricating the array substrate having a double-gate line structure is disclosed. The method includes:

Forming a plurality of gate lines and a plurality of data lines over a substrate, wherein the plurality of gate lines and the plurality of data lines cross one another to define a plurality of pixel regions, two gate lines are arranged between two adjacent rows of pixel regions, and two columns of pixel regions are arranged between two adjacent data lines;

Forming a pixel electrode in each pixel region, wherein the orthographic projection of a data line on the substrate is configured to overlap with orthographic projection of the each pixel electrode on the substrate to thereby prevent light leakage in the pixel region.

Because a data line is disposed on only one side of each pixel region, in order to prevent the light leakage in the surrounding sub-region of the pixel region that does not correspond to the data line, the method for fabricating the array substrate further includes:

Forming a shielding layer at a surrounding sub-region between the pixel electrode and the gate line in each pixel region.

In a TN-subtype thin-film transistor liquid crystal display apparatus, the common electrodes are formed in a color film substrate. In order to increase the storage capacitance, the method for fabricating the array substrate further includes:

Forming a thin-film transistor in each pixel region;

Forming a passivation layer between a drain electrode of the thin-film transistor and a pixel electrode, wherein the passivation layer comprises an organic insulating layer, the passivation layer is provided with a via, and the pixel electrode is electrically connected with the drain electrode through the via;

Forming the shielding layer, wherein a portion of the drain electrode corresponding to the via is faced directly with the shielding layer to thereby form a storage capacitor between the drain electrode and the conductive pattern upon application of a common voltage on the shielding layer.

In some preferred embodiments, the shielding layer of all of the plurality of pixel regions can be formed by a patterning process over a same metal layer. Specifically, the gate lines and the shielding layer of all pixel regions can be formed by the patterning process over a same gate metal layer.

The methods for forming other parts of the array substrate can be referenced to prior art and are not repeated herein.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
   a substrate;
   a plurality of gate lines and a plurality of data lines, disposed over the substrate and arranged in rows and columns respectively; and
   a plurality of pixel regions, each arranged in an area defined by crossing gate lines and data lines and comprising a pixel electrode;
   wherein:
      the plurality of data lines are configured such that in each pixel region, orthographic projection of any one of the plurality of data lines on the substrate and orthographic projection of a corresponding pixel electrode on the substrate has an overlapping area having a width of ≥0 µm;
   the array substrate further comprises:
   a shielding layer, disposed over, and configured to reduce or prevent light leakage from, a periphery of each pixel region; and
   a plurality of thin-film transistors, each arranged in one of the plurality of pixel regions and comprising a gate electrode,
   the gate electrode, the shielding layer and the plurality of gate lines are disposed in a same gate metal layer and comprise a same composition;
   each thin-film transistor further comprises:
      a drain electrode, wherein the drain electrode and the shielding layer are configured to substantially contribute to a storage capacitance of the pixel in each pixel region; and
      a passivation layer,
   the passivation layer is disposed between, and configured to insulate, the drain electrode and the pixel electrode in each pixel region;
   the passivation layer is provided a via, configured to electrically couple the pixel electrode with the drain electrode therethrough;
   the passivation layer comprises at least one organic insulating layer;
   in each pixel region, the storage capacitance comprises a first storage capacitor and a second storage capacitor;
   a portion of the drain electrode corresponding to the via is disposed to directly face the shielding layer to thereby form the first storage capacitor; and
   the pixel electrode and the shielding layer are configured to form the second storage capacitor.

2. The array substrate of claim 1, further comprising at least one organic insulating layer, disposed between any one of the plurality of data lines and the corresponding pixel electrode in each pixel region.

3. The array substrate of claim 1, wherein in each pixel region, orthographic projection of the shielding layer on the substrate overlaps with a gap between orthographic projection of any of the plurality of gate lines and orthographic projection of the pixel electrode.

4. The array substrate of claim 1, wherein two of the plurality of gate lines are arranged between every two adjacent rows of pixel regions, and two columns of pixel regions are arranged between every two adjacent data lines.

5. The array substrate of claim 4, wherein each of the plurality of data lines comprises a first portion, disposed over a first gap between two adjacent pixel regions, and configured such that a width of the first portion of the each data line is substantially equal to, or more than, a width of the first gap between the two adjacent pixel regions.

6. The array substrate of claim 5, wherein the shielding layer comprises a second portion, disposed over a second gap between two neighboring pixel regions arranged between two adjacent data lines of the plurality of data lines, and configured such that a width of the second portion of the shielding layer is substantially equal to, or more than, a width of the second gap between the two neighboring pixel regions.

7. The array substrate of claim 1, wherein the width of the overlapping area is ranged about 2-3.5 μm.

8. The array substrate of claim 1, wherein the shielding layer is electrically coupled to a common electrode.

9. The array substrate of claim 1, wherein each of the plurality of thin-film transistors further comprises a gate insulating layer, disposed over the gate metal layer and comprising at least one organic insulating layer.

10. A display apparatus, comprising an array substrate according to claim 1.

11. A method for fabricating the array substrate of claim 1, the method comprising:
    forming the plurality of gate lines over the substrate;
    forming the plurality of data lines, wherein the plurality of gate lines and the plurality of data lines cross one another to define a plurality of areas for arranging each of a plurality of pixel regions therein; and
    forming the pixel electrode in each of the plurality of pixel regions.

12. The method according to claim 11, wherein the forming the plurality of gate lines over the substrate comprises:
    forming the plurality of gate lines and the shielding layer over a substrate.

13. The method according to claim 12, wherein:
    the array substrate comprises the plurality of thin-film transistors, each disposed in each pixel region and comprising a gate electrode, a drain electrode, and a source electrode; and
    the forming the plurality of gate lines over the substrate comprises:
        forming the gate electrode and the shielding layer and the plurality of gate lines by patterning over a gate metal layer.

14. The method according to claim 13, further comprising, between the forming a plurality of gate lines over a substrate and the forming a plurality of data lines:
    forming a gate insulating layer over the gate electrode and the shielding layer and the plurality of gate lines, wherein the gate insulating layer comprises at least one organic insulating layer.

15. The method according to claim 13, further comprising, between the forming the plurality of data lines and the forming the pixel electrode in each of the plurality of pixel regions:
    forming the drain electrode and a passivation layer in each pixel region, wherein the passivation layer comprises an organic insulating layer and is provided with a via, and the pixel electrode is electrically coupled with the drain electrode through the via.

* * * * *